Aug. 18, 1970 J. D. HARNDEN, JR., ET AL 3,524,997
MONOLITHIC INTEGRATED PHASE CONTROL CIRCUITS
Filed Sept. 8, 1967 3 Sheets-Sheet 1

Inventors:
John D. Harnden, Jr.
Jerry L. Stratton,
Donald L. Watrous,
by Donald R. Campbell
Their Attorney.

MONOLITHIC INTEGRATED PHASE CONTROL CIRCUITS

Inventors:
John D. Harnden, Jr.
Jerry L. Stratton,
Donald L. Watrous,
by Donald R. Campbell
Their Attorney.

Inventors:
John D. Harnden, Jr.
Jerry L. Stratton,
Donald L. Watrous,
by Donald R. Campbell
Their Attorney.

United States Patent Office 3,524,997
Patented Aug. 18, 1970

3,524,997
MONOLITHIC INTEGRATED PHASE CONTROL CIRCUITS

John D. Harnden, Jr., and Jerry L. Stratton, Schenectady, and Donald L. Watrous, Scotia, N.Y., assignors to General Electric Company, a corporation of New York Filed Sept. 8, 1967, Ser. No. 666,378
Int. Cl. H03k *1/12, 17/00*
U.S. Cl. 307—252 26 Claims

ABSTRACT OF THE DISCLOSURE

In a monolithic phase control circuit, a transistor or SCR shunts the D-C output of a full wave diode bridge, and the phase retard for turning on the shunting device is derived from an RC circuit coupled to the gate of an insulated gate field-effect transistor. The charging element in the timing circuit is a photoconductor, photodiode or light, or magnetic sensitive field-effect transistor having external input to vary the phase angle. To develop a thyristor gating signal, the diode bridge is coupled across two terminals of the thyristor; and for an inductive load another full wave diode bridge for the timing circuit commences timing at voltage zero. In a hybrid circuit, an intermediate voltage is tapped for the first diode bridge, and a conventional RC circuit coupled across the thyristor has its time constant shortened by the conductivity of the shunting device as determined by resistive sensors.

This invention relates to solid state phase control circuits, and more particularly to phase control circuits which can be fabricated as monolithic integrated circuits.

The determination of the amount of phase retard of a phase control signal is frequently implemented by the charging of a capacitor through a resistance. In considering the design of a phase control circuit which is suitable for manufacture as a monolithic integrated circuit, the limitations of integrated circuit technology as presently known are such that larger sizes of capacitors having sufficient capacitance for use in such a prior art circuit cannot be fabricated. If the timing determination for the angle of phase retard is to be obtained from an RC circuit combination, it is seen that for commercial power line frequencies of 50 or 60 c.p.s., the charging resistance has to be very large in order to obtain usable time constants for the small sizes of capacitors (recent reports disclose parallel arranged capacitors having a total capacitance of 4000 picofarads) that can be fabricated on an integrated circuit chip. At such large impedance levels, however, it is not possible to bring leads out of the circuit without degrading the performance of the circuit. Improved methods of varying the resistance in the timing circuit which are consistent with integrated circuit fabrication and the other problems presented provide an opportunity to contribute to the art an inexpensive phase control circuit in integrated circuit form.

Although having general utility, the monolithic phase control circuits are here illustrated as employed as gating circuits for controlled semiconductor switching devices such as the various types of thyristors, of which the most common are the silicon controlled rectifier, the triac, and the diac. Thyristors are rendered conductive for current flow through the device from one load terminal to the other upon the application of a gating signal or firing signal to the device, assuming that an appropriate potential appears across the load terminals of the device. For this application, phase control circuits generate the gating signal at a fixed or variable phase with respect to the supply potential for energizing the load terminals of the device, so that the period of current flow through the device is reduced from a maximum of 180° by the amount of phase retard. In such phase control gating circuits as heretofore known, the energy for the gating signal is commonly derived from a storage capacitor, and the timing is obtained from an RC charging circuit as just discussed. Since only relatively small sizes of integrated capacitors can be made, a monolithic integrated phase control circuit for developing a gating signal must obtain the energy for the gating signal in some other way.

Accordingly, an object of the invention is to provide new and improved phase control circuits which can be fabricated in whole or in part as monolithic integrated circuits and can be used for a variety of purposes.

Another object is the provision of new and improved phase control circuits wherein the portion of the circuit for determining the time delay of the phase control signal can be fabricated in monolithic integrated circuit form as an RC timing circuit having a high impedance level and an external input for varying the time delay.

Yet another object of the invention is the provision of new and improved monolithic integrated phase control circuits for controlled semiconductor switching devices which derive the energy for the gating signal from the load current carrying circuit in which the switching device is connected.

A further object is to provide new and improved phase control circuits of the foregoing type which are especially suitable for supplying the phase delayed gating signals to a thyristor device.

In accordance with the invention a monolithic integrated phase control circuit comprises coupling means and gating means having input means and comprising a conductivity controlled semiconductor conducting device having control means. The coupling means and the gating means are preferably provided as separate means. Timing circuit means comprises the series combination of a relatively small timing capacitor and a solid state sensing device whose conductivity is changed by externally applied input control signals to vary the charging rate of the timing capacitor. Means for applying a turn-on signal to the conductivity controlled semiconductor conducting means comprises a high input impedance solid state conducting device which has an electrode connected to the junction of the sensing device and the timing capacitor.

In the preferred embodiments, there is provided additionally a source of input control signals coupled to the sensing device, and means for varying the input control signals in accordance with a control function. A variety of sensing devices can be used, including those responsive to light, magnetic or pressure stimuli. The high input impedance device is an enhancement mode insulated gate field-effect transistor having its gate electrode connected directly to the junction of the sensing device or timing circuit. When used to generate a gating signal for a thyristor, the output of the phase control circuit is effectively coupled across two of the terminals of the thyristor. In a hybrid circuit, a conventional RC circuit coupled across the thyristor has its time constant shortened by the conductivity of the shunting device as determined by resistive sensors.

The foregoing and other objects, features, and advantages of the invention will be apparent from the following more particular description of preferred embodiments of the invention, as illustrated in the accompanying drawings wherein.

Figure 2:
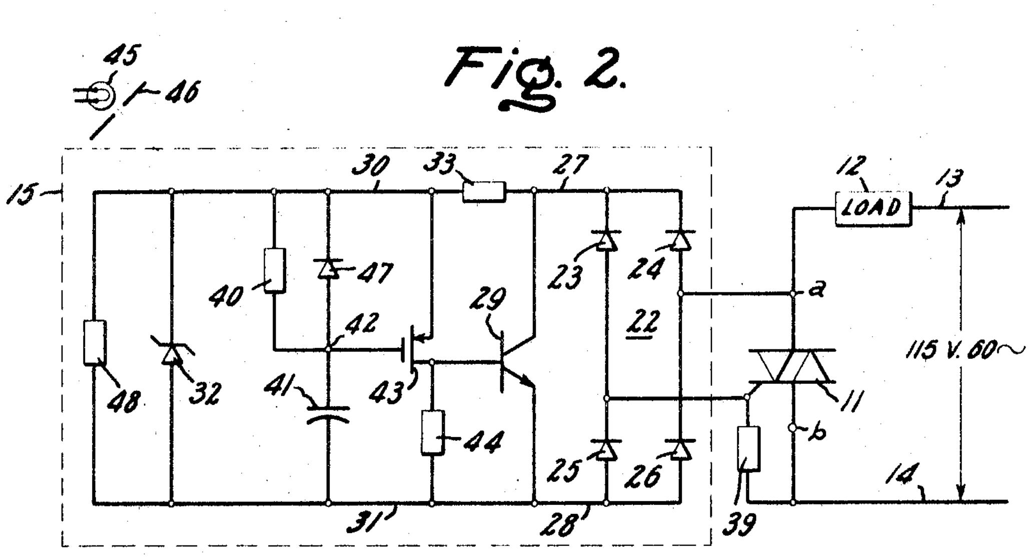
FIG. 2 is a schematic circuit diagram of another embodiment of the invention wherein the phase control circuit is supplied with power at full line voltage and features a novel timing circuit which employs a sensor having an external input.
Figure 2A:
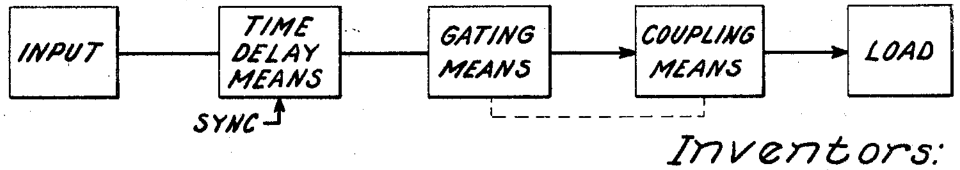
Figure 3:
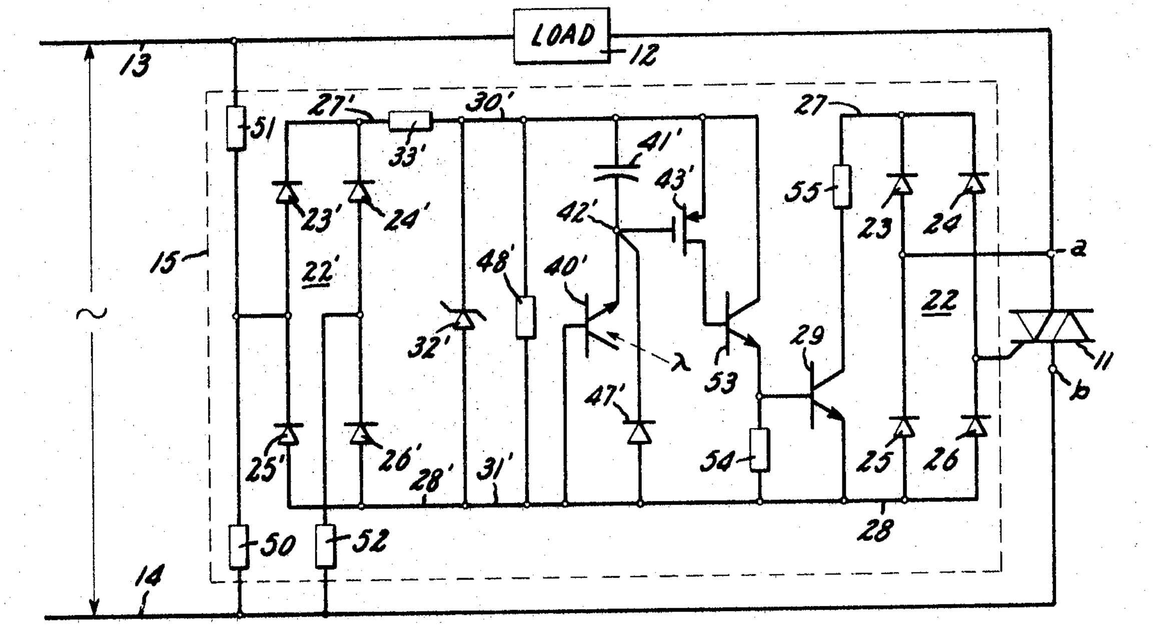
Figure 6:
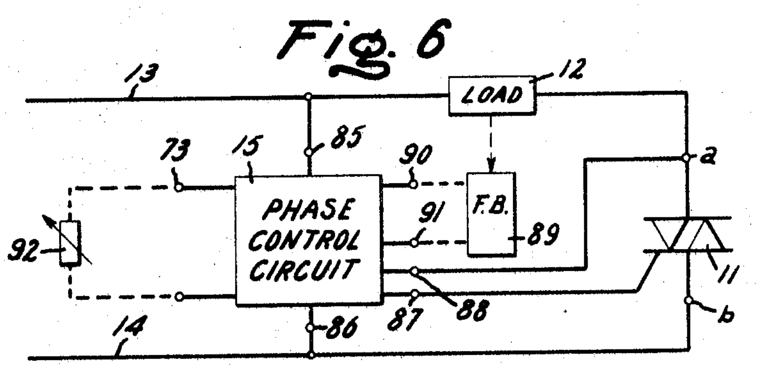
Figure 7:
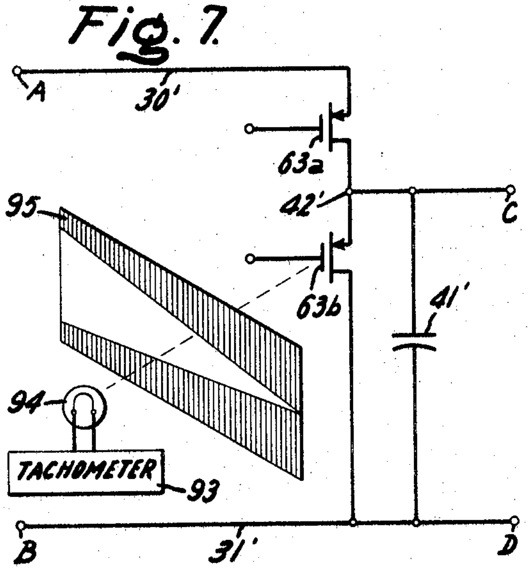
Figure 5:
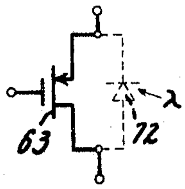
Figure 8:
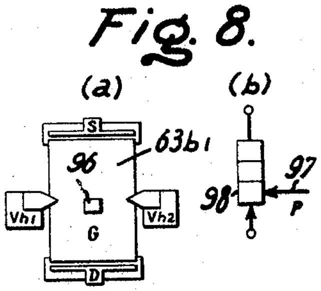
Figure 4:
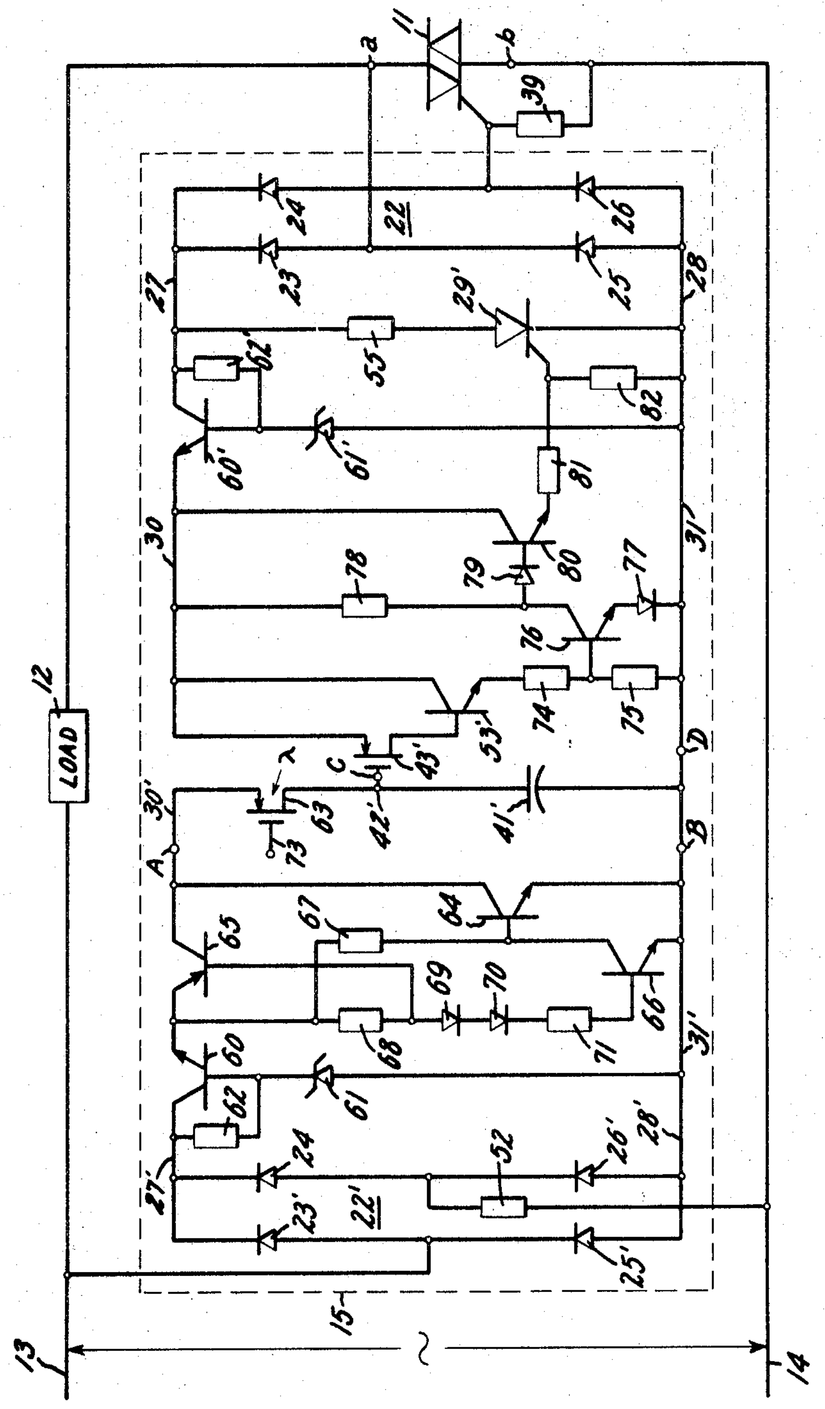

FIG. 2*a* is a schematic block diagram illustrating the basic elements of a monolithic phase control circuit;

FIG. 3 is a schematic circuit diagram of a modification of the circuit shown in FIG. 2 which is particularly suitable for inductive type loads;

FIG. 4 is a schematic circuit diagram of a phase control circuit which is similar to FIG. 3 and is a preferred form of the invention;

FIG. 5 is a schematic equivalent diagram of the light sensitive sensor shown in FIG. 4;

FIG. 6 is a simplified diagram illustrating one manner of utilizing the two control signal inputs to the sensor shown in FIG. 4;

FIG. 7 is a schematic circuit diagram of an alternative form of timing circuit which can be substituted for the timing circuit of FIG. 4; and FIG. 8, (*a*) and (*b*) are diagrams of other types of sensors whose conductivity can be changed by externally applied control signals.

Figure 1:
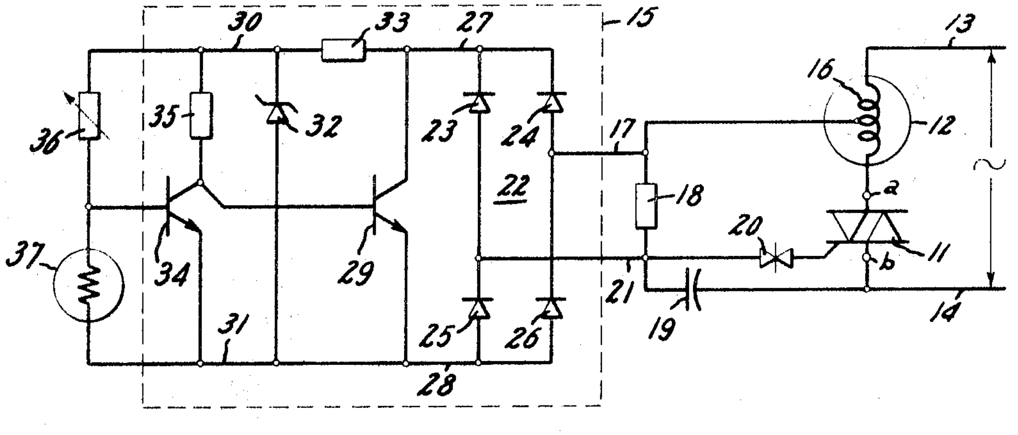
FIG. 1 is a schematic circuit diagram of a power circuit employing a gate controlled power switching semiconductor and a phase control circuit therefor constructed in accordance with the teachings of the invention, wherein the phase control circuit is supplied with power at an intermediate voltage and employs a conventional sensor and timing circuit.

The power circuit shown in FIG. 1 comprises the series combination of a load current carrying power semiconductor switching means 11 and a load 12 connected across a pair of power supply terminals 13 and 14 which in turn are adapted to be connected across a source of electric potential, such as the commonly available 115 volt, 60 c.p.s. alternating current supply. The load current carrying semiconductor switching means 11 is a gate controlled bidirectional conducting means which supplies alternating current to the load 12, and is preferably a triac bidirectional conducting device. The triac is a multilayered power semiconductor having a gate electrode or terminal and a pair of load terminals *a* and *b*, and upon the application of a gating signal to the gate electrode the triac conducts current in one direction when the load terminal *a* is positive with respect to the load terminal *b*, and conducts current in the other direction when the load terminal *b* is positive with respect to the load terminal *a*. In an alternating current circuit, the triac 11 is rendered non-conductive after a period of conduction upon passing through the next current zero, at which time the current through the device is below a minimum holding value. Since the triac device 11 must be gated on for each half cycle of the line voltage, or possibly each half cycle of the line current when the load 12 is inductive in character, it is seen that the voltage to the load 12 can be reduced by delaying the phase of turn-on of the triac 11 beyond the voltage zero or current zero. The amount of phase retard can be varied continuously to change the amount of voltage supplied to the load 12, or the voltage supplied to the load 12 can be reduced to a specific value by gating on the triac 11 at a fixed phase retard angle.

Although the load 12 can be resistive or inductive in character, for purposes of illustration the load 12 is assumed to be a single phase motor for driving a small electrical appliance such as a fan. The remainder of the circuitry shown in FIG. 1 is a phase control circuit means for deriving a gating signal for application to the gate electrode of the triac power switching device 11 to render it conductive at a variable phase of the line power supply. In this particular circuit in which the load 12 is a fan motor, the temperature is sensed and the gating signal is derived relatively early in the half cycle following a current zero when the temperature is high and more voltage is to be supplied to load 12 to make the fan motor run faster, or is derived proportionately later in the half cycle following a current zero when the sensed temperature is lower and less voltage is to be supplied to the fan motor 12 to make it run proportionately slower. The portion of the phase control circuit means within the dashed line box is suitable for fabrication as a monolithic integrated circuit on a monolithic chip 15 such as a silicon chip. In view of the fact that there are a number of discrete components in addition to the integrated circuit portion (those which appear outside the dashed box), this phase control circuit may be designated as a hybrid scheme. It will be understood, moreover, that the discrete components can appear on the chip itself when packaged as a hybrid integrated circuit. As will be explained in detail later, the FIG. 1 circuit uses conventional sensors and a conventional RC timing circuit, and furthermore the monolithic integrated circuit portion on the chip 15 is supplied with an intermediate voltage which is less than the line voltage across the power supply terminals 13 and 14.

To obtain intermediate voltage, the single phase winding 16 of the fan motor is tapped at an intermediate point to provide a first intermediate voltage supply terminal 17. The timing circuit for determining the phase delay for generating a gating signal for the triac 11 is composed of the series combination of a charging resistor 18 and a charging capacitor 19 connected between the intermediate voltage supply terminal 17 and the line power supply terminal 14. The junction of the resistor 18 and capacitor 19 is operatively coupled to the gate electrode of the triac device 11 through a conductivity controlled bidirectional conducting device 20. The device 20 is what is commonly called a threshold device snap switch, and is more particularly a voltage sensitive device which breaks down and conducts current in either one of two directions upon the voltage across the device rising to a predetermined firing level. Upon the voltage across the device 20 dropping to below a predetermined holding level, the device resumes its blocking condition. In the absence of the remainder of the phase control circuit on the monolithic chip 15, the operation of the timing circuit is that the capacitor 19 charges through the charging resistor 18, and when the voltage on the charging capacitor 19 reaches a predetermined level the snap switch device 20 is rendered conductive to apply a gating signal to the gate electrode of the triac device 11. The triac 11 is conductive until the next current zero, at which time it turns off and a new timing cycle begins. This establishes a minimum voltage to be supplied to the fan motor winding 16, and sets a maximum amount of retard of the phase angle for gating on or firing the triac 11. It will be seen that the remainder of the phase control circuit means shortens the phase retard by an amount proportional to the sensed temperature. This circuitry is supplied with an intermediate voltage by being connected between a second intermediate voltage supply terminal 21, which is connected to the junction of the charging resistor 18 and the charging capacitor 19 and is thus operatively coupled to the gate electrode of the triac 11, and the other intermediate voltage supply terminal 17 which is operatively coupled to a point on the power circuit.

The alternating current intermediate supply terminals 17 and 21 are connected to the input terminals of a full wave rectifying means comprising a plurality of unidirectional conducting devices, and is preferably a full wave diode bridge 22 comprising the four diodes 23, 24, 25, and 26 interconnected together as shown. The output terminals of the diode bridge 22 provide a pair of intermediate (or relatively high) voltage direct current terminals 27 and 28. It is seen that the intermediate voltage D-C output terminal 27 is positive whereas the terminal 28 is negative. The load terminals of a transistor 29, or other suitable gate controlled unidirectional conductivity controlled semiconductor conducting means, are connected across the intermediate voltage D-C supply terminals 27 and 28 to shunt the output of the diode bridge 22 when the transistor 29 is rendered conductive. In this circuit, the transistor 29 is an NPN junction transistor having its collector connected to the intermediate voltage D-C output terminal 27 while the emitter is connected to other terminal 28. Upon the application of a turn-on signal to the base electrode of the transistor 29, it is rendered conductive to have a variable impedance in accordance with the magnitude of the turn-on signal, and effectively shunts the charging resistor 18 of the timing circuit. When the line power supply terminal 13 is positive with respect to the other power supply terminal 14, the diode 24 of the diode bridge is conductive, and the circuit path is completed through the collector-to-emitter conducting path of the transistor 29 and the diode 25 to the junction of the charging resistor 18 and the charging capacitor 19. On the other half cycle when the line power supply terminal 14 is positive with respect to the power supply terminal 13, the circuit is through the diode 23, the transistor 29, and the diode 26 to shunt the charging resistor 18 in essentially the same manner. By varying the impedance of the conducting path of the transistor 29, the phase angle at which the snap switch device 20 is rendered conductive is advanced more or less from the maximum retard angle established by the charging resistor 18 acting alone.

The means for applying a turn-on signal to the base electrode or control electrode of the transistor 29 is operatively coupled across a pair of low voltage D-C supply terminals 30 and 31 connected across a Zener diode 32 which clips the reduced voltage obtained by connecting a dropping resistor 33 in series circuit relationship with the intermediate voltage D-C supply terminal 27. The means for applying a turn-on signal to the control electrode of the transistor 29 is provided by a transistor amplifier 34 which is more specifically an NPN junction transistor having its emitter connected to the negative low voltage D-C supply terminal 31 and its collector connected directly to the base electrode of the transistor 29 and also through a resistor 35 to the positive low voltage D-C supply terminal 30. The base electrode of the transistor amplifier 34 is connected to the junction point of a voltage divider comprising the series circuit combination of a variable reference resistor 36 and a resistive temperature sensing means connected across the low voltage D-C supply terminals 30 and 31. The resistive temperature sensing means is desirably a negative temperature coefficient thermistor 37 whose resistance decreases in value as the temperature rises. Having set the reference resistor 36 at the correct point, the thermistor 37 varies the base-emitter bias applied to the transistor amplifier 34 to tend to turn the transistor 34 off when a low temperature is sensed, and to turn on the transistor 34 at a predetermined temperature and to increase the conductivity of the collector-to-emitter conducting path of the transistor 34 as increasingly higher temperatures are sensed.

In the operation of the circuit of FIG. 1, it is observed that with the transistor 34 non-conducting, the turn-on signal applied to the base electrode of the transistor 29 through the resistor 35 is at its maximum value, whereas when the transistor 34 has maximum conductivity the turn-on signal applied to the base electrode of the transistor 29 is at its minimum value. Thus, when the thermistor 37 senses a high temperature the transistor 34 tends to turn off so that a maximum turn-on signal is applied to the transistor 29 and the impedance of its collector-to-emitter conducting path is minimum. Consequently, the charging resistor 18 is shunted by a low impedance and the charging capacitor 19 charges faster to decrease the phase angle at which the snap switch 20 is fired to apply a phase control or gating signal to the triac device 11. This increases the voltage supply to the fan motor winding 16 thereby increasing the speed of the fan. On the other hand, when the thermistor 37 senses a relatively low temperature, the transistor amplifier 34 is rendered conductive to its fullest extent thus decreasing the magnitude of the turn-on signal supplied to the transistor 29. In this case the impedance of the conducting path of the transistor 29 is relatively high and shunts the charging resistor 18 to a lesser extent, thereby delaying the phase angle at which the voltage on the charging capacitor 19 fires the snap switch device 20 to turn on the triac 11. Thus, the fan motor winding 16 is supplied with less voltage and the fan runs slower.

The integrated circuit portion of the FIG. 1 circuit included on the chip 15 clearly can be fabricated by monolithic technology as presently known. The diode bridge 22, instead of operating at an intermediate voltage less than line voltage, can if desired be operated at full line voltage. High voltage isolation for the devices in the diode bridge can be obtained for instance by the use of appropriate beam lead or mosaic techniques in fabricating the monolithic silicon chip. In this case the tap on the fan motor winding 16 can be eliminated and the A-C intermediate voltage supply terminal 17 can be connected directly to the opposite load terminal *a* of the triac device 11. The input terminals of the diode bridge 22 will then be connected between the gate electrode of the triac 11 and the opposite load terminal. It will be noted that the reference resistor 36 and the thermistor 37 in the temperature sensitive portion of the circuit are not included on the integrated circuit chip, and the charging resistor 18 and the storage capacitor 19 of the timing circuit if on the chip at all are in hybrid form. The storage capacitor 19 is ordinarily too large to be fabricated by monolithic integrated circuit technology, considering that it is used to obtain reasonable delays for a 60 c.p.s. supply voltage wherein the duration of the half cycle is 8 milliseconds. The snap switch threshold device 20 for firing the triac 11 is sometimes included in the same package as the power semiconductor. The triac device 11 per se is also known as a bidirectional thyristor, and is functionally equivalent to two inverse parallel connected silicon controlled rectifiers. This circuit can be used to control two such SCRs or, if desired, a transistor or a single SCR.

In FIG. 2, the entire phase control circuit means is included on the monolithic integrated circuit chip 15. Before discussing this circuit in detail, however, the basic elements of a monolithic phase control circuit according to the teaching of the invention in its broadest scope will be reviewed with regard to the schematic block diagram of FIG. 2*a*. An input means applies an input to the time delay means which is synchronized with a cyclically varying supply so that the timing begins at a predetermined point. The time delay means actuates a gating means when the desired phase delay has occurred, and the output of the gating means is coupled through a coupling means to the load. The function of the last three blocks may be provided by thyristor action, and in an advanced form of the circuit the gating means and coupling means may be provided by a single A-C device as indicated by the dashed line between these blocks.

In the FIG. 2 circuit the power supply for the phase control circuit is operated at line voltage, a relatively small timing capacitor is used in conjunction with a novel high impedance level charging circuit, and an external light signal input is utilized to determine the phase retard of the gating signal. The bidirectional conducting triac device 11 as before is connected in series circuit relationship with the load 12, which is preferably resistive but may be inductive in character under certain conditions, across the line voltage power supply terminals 13 and 14. The input terminals of the full wave diode bridge 22 are connected between the gate terminal of the triac 11 and the opposite load terminal *a*. A voltage limiting resistor 39 located external to the chip 15 is connected between the gate of the triac 11 and the adjacent load terminal *b* to complete a circuit path for the gating signal.

Since the supply for the high voltage diode bridge 22 is substantially equal to the alternating current line voltage across the supply terminals 13 and 14, the direct current output terminals 27 and 28 of the diode bridge 22 are also at high voltage, and the transistor 29, which has its load terminals connected across the high voltage direct current output terminals 27 and 28, likewise operates at high voltage. In contrast to the circuit of FIG. 1 wherein the energy for the signal is derived from the storage capacitor 19, the energy for the gating signal in the circuit of FIG. 2 is derived directly from the main load circuit connected across the power supply terminals 13 and 14. When load terminal *a* is positive with respect to load terminal *b* of triac 11, the circuit path is through the diode 24, the conducting transistor 29, and the diode 25 directly to the gate of the triac 11. On the other half cycle, the circuit path is completed through the diode 23, the transistor 29, and the diode 26. It goes without saying that there is sufficient energy in the main power circuit to develop a gating signal to fire the triac 11, without the need to resort to storage capacitors. The transistor 29 serves as a shunting means or a gating means.

As in the previous circuit, a pair of low voltage direct current supply terminals 30 and 31 are obtained by employing the Zener diode 32 in conjunction with the dropping resistor 33. The timing circuit comprises the series combnation of an electro-optical device such as a photoconductor or photoresistor 40 and a relatively small integrated circuit capacitor 41. To be economically integratable, a capacitor at the present time should have a capacitance in the range of about 30 to 100 picofarads. A capacitor this small presents many problems in the timing circuit. For example, the current needed to charge a 100 picofarad capacitor to 10 volts in 8 milliseconds (one half cycle) is $125\times10^{-9}$ amps. This would mean that if simple RC timing were used, a resistance of about $10^9$ ohms would be needed. It is common knowledge that at these impedance levels leads cannot be brought out of the circuit package without noise pick-up problems. In the circuit of FIG. 2, the junction point 42 between the resistor 40 and capacitor 41 of the timing circuit is made a high impedance point without making the resistor 40 unduly large by connecting the junction point 42 to the gate electrode of a high input impedance gate controlled device such as an insulated gate field-effect transistor 43. The source electrode of the insulated gate field-effect transistor 43 is connected to the positive low voltage D-C supply terminal 30 while its drain electrode is connected directly to the base electrode of the transistor 29 and also through a bias developing resistor 44 to the negative low voltage D-C supply terminal 31.

The field-effect transistor 43 is more particularly a P-channel enhancement mode metal oxide semiconductor field-effect transistor. In this type of transistor, conventional current flow through a channel from the source electrode to the drain electrode is initiated by the appearance at the gate electrode of a voltage which is equal to or greater than the threshold voltage. When the gate-to-source voltage is below a specified threshold value, the field-effect transistor 43 is non-conducting. The gate electrode of an insulated gate type field-effect transistor moreover is insulated from the source and drain electrodes and from the conducting channel established between them, and as a result the metal oxide semiconductor field-effect transistor 43 has an inherently high input impedance on the order of about $10^{15}$ ohms. The high input impedance of the insulated gate field-effect transistor 43 further prevents the timing capacitor 41 from being shunted when connected across the gate and drain electrodes as shown.

In the operation of the timing circuit portion of FIG. 2, constant intensity light from a source 45 is reduced by a shutter 46 in accordance with a control function and is directed onto the photoconductor 40 which has a resistance dependent upon the amount of light incident upon it. The charging capacitor 41 is charged by the current passing through the photoconductor 40, and when a voltage equal to the threshold voltage at the gate of the insulated gate field-effect transistor 43 is reached, the transistor 43 is rendered conductive. In this manner the voltage on the timing capacitor is sensed and a turn-on signal is produced which is supplied to the base electrode of the transistor 29, rendering it conductive to shunt the output terminals of the diode bridge 22 and apply a gating signal to the gate electrode of triac device 11. The phase at which the field-effect transistor 43 is rendered conductive to apply a turn-on signal to the transistor 29 can be varied by changing the resistance value of the charging photoconductor 40, which in turn is dependent on the control function for setting the position of the shutter 46. When the triac device 11 is rendered conductive, there is no voltage supply for the diode bridge 22, and a diode 47 having its anode connected to the junction point 42 and its cathode to the low voltage D-C supply terminal 30 is rendered conductive to discharge capacitor 41 through a discharge resistor 48 connected between the two low voltage D-C supply terminals 30 and 31.

A typical use for the light actuated phase control circuit of FIG. 2 is as a lamp dimmer. Thus the load 12 is a lamp and by advancing the phase retard of grating on of the triac device 11 the voltage to the lamp is reduced. The externally applied optical input to the circuit provides an inexpensive control in which there is additionally desirable isolation between the input and output circuits. By manually changing the position of the shutter 46, the user can set the amount of phase retard of the gating signal to dim the lamp by the desired amount. By way of illustration, another use for this phase control circuit is for motor speed control in such consumser products as fans, blowers, and washers.

While the start of timing of the phase delay angle at the current zero, as is done in the FIG. 2 circuit, is suitable for many inductive loads, it is not suitable for all inductive loads. To obtain stable reliable phase control of an inductive load, the phase delay angle must start at line voltage zero and at the same time the phase delay may not be smaller than the power factor of the load. If the phase delay angle is less than the phase angle of the load, the circuit may attempt to fire the triac or other switching device before suitable latching current is available and result in a complete half cycle of non-conduction instead of conduction. If the phase delay angle is initiated at current zero, an unstable mode of operation can occur in which a large direct current component of current is supplied to the inductive load which would be unsuitable in many applications.

Referring to FIG. 3, to provide the circuitry for beginning the timing of the phase delay angle at the line voltage zero, a second full wave diode bridge 22′ or other suitable full wave rectifying means has one of its input terminals connected to the juncture of a pair of dropping resistors 50 and 51 connected across the line voltage power supply terminals 13 and 14, while the other input terminal is connected through a limiting resistor 52 to the power supply terminal 14. Diodes in the diode bridge 22′ which correspond in function to the diodes in the previously described diode bridge 22 are given corresponding primed numerals. A dropping resistor 33′ is connected in series circuit relationship with the positive high voltage D-C output terminal 27′, and the reduced voltage produced in this manner is further clipped by a Zener diode 32′ connected between the other end of the resistor 33′ and the negative high voltage D-C output terminal 28′. Across the low voltage D-C supply terminals 30′ and 31′ obtained in this manner are connected the timing capacitor discharge resistor 48′ and also the timing circuit per se comprising the series combination of the relatively small charging capacitor 41′ and a resistive element in the form of a light variable photodiode or phototransistor 40′. Polycrystalline photodetectors or some other electro-optical device whose conductivity varies with the amount of light incident upon it can also be employed as the sensor. The high impedance junction point 42′ between the timing capacitor 41′ and the resistive element 40′ is connected to the gate electrode of a metal oxide semiconductor field-effect transistor 43'. Discharge diode 47' is also coupled between junction point 42' and the negative D-C supply terminal 31'.

The insulated gate field-effect transistor 43' is a P-channel enhancement device having its source electrode connected to the low voltage D-C supply terminal 30'. Incident light falling upon the phototransistor 40' charges the timing capacitor 41' such that the plate adjacent the junction point 42' approaches the negative low voltage D-C supply terminal 31'. As the gate electrode of the metal oxide semiconductor field-effect transistor 43' becomes less positive, the source-to-gate voltage of the transistor 43' reaches the threshold voltage and the transistor 43' is rendered conductive for passage of current from its source through the conducting channel to its drain electrode. The drain electrode is coupled directly to the base of an NPN transistor amplifier 53 whose collector is connected in regenerative feedback relation to the source of the field-effect transistor 43'. The emitter electrode of the transistor amplifier 53 is connected directly to the base of the transistor 29, and is also coupled through a biasing resistor 54 to the negative low voltage D-C supply terminal 31'. As the field-effect transistor 43' turns on, current from the drain electrode is injected into the base-emitter of the transistor amplifier 53, rendering it conductive, and current through the emitter electrode of the transistor 53 and the biasing resistor 54 raises the potential of the emitter of transistor 53 which in turn raises the potential of the drain of the field-effect transistor 43', tending to increase its conductivity and turn it on harder. There is a resulting relatively fast rising turn-on signal applied to the base of the transistor 29. The collector of the transistor 29 is connected through a limiting resistor 55 to the positive high voltage D-C output terminal 27 of the first diode bridge 22. The operation of the first diode bridge 22 and the transistor 29 which shunts its output terminals to apply a gating signal to the gate electrode of the triac device 11 is otherwise the same.

In order to complete the gating circuit of the triac device 11 from the gate electrode to the adjacent load terminal *b*, the two high voltage D-C output terminals 28 and 28' of the two diode bridges 22 and 22' at opposite ends of the circuit, and also the negative low voltage D-C supply terminal 31', are all tied together. Upon initially supplying current to the line voltage power supply terminals 13 and 14, it will be noted that the line power supply current will not fire the triac device 11 by applying a gating signal to its gate electrode because line current is diverted through the resistor 52 connected to one of the input terminals of the diode bridge 22'. On the other hand, the energy for the gating signal derived by turning on the shunting transistor 29 passes through the diode bridge 22 to supply a gating signal to the triac device 11, rather than being diverted through the other diode bridge 22' and the resistor 52, because there is then a higher current and the drop across the resistor 52 increases so that the firing energy is not diverted.

To review briefly the operation of the circuit of FIG. 3, at the appearance of the voltage zero in the line voltage power supply terminals 13 and 14, there is no voltage supply for the second diode bridge 22' and the timing capacitor 41' discharges through the discharge diode 47' and a new timing cycle commences. The amount of light incident upon the phototransistor 40' determines the amount of phase delay. When the capacitor voltage or the voltage at junction point 42' reaches the threshold voltage of the field-effect transistor 43', it is rendered conductive and the transistor amplifier 53 increases the gain of the turn-on signal applied to the base of the transistor 29. When the transistor 29 is rendered conductive, a gating signal which derives its energy from the main power circuit is applied to the gate of the triac device 11 rendering it conductive. Should the phase retard angle of turn-on of the transistor 29 be such that the current through the load 12, which is an inductive type load, is going through a current zero or is near a current zero, there will be insufficient energy to fire the triac device 11. However, the timing capacitor 41' applies a continuous gating signal to the field-effect transistor 43' so that the turn-on signal applied to the transistor 29 also appears continuously until such time as there is sufficient energy for the gating signal to fire the triac device 11. As will be explained in detail later, the control signal for determining the amount of light incident upon the phototransistor 40' can be employed either in an open-loop system such as the lamp dimmer, mentioned previously, or in a closed-loop system employing feedback from the load 12 such as for speed or temperature control of a motor. The isolated input arrangement shown in FIG. 2, can be used employing a constant intensity light source and a movable shutter which is actuated in accordance with the input control signal.

The circuit shown in FIG. 4 is a variation of the FIG. 3 circuit and is the preferred embodiment of the invention when the load 12 is inductive in character. In this circuit the timing of the circuit on both half cycles of the supply potential is completely symmetrical. As in FIG. 3, timing of the phase delay angle starts at the voltage zero and for this reason the circuit employs the second full wave diode bridge 22' having one input terminal connected directly to the line voltage supply terminal 13 while the other input terminal is connected through the resistance 52 to the other line voltage supply terminal 14 so that line current will not fire the triac device 11. To obtain a low voltage D-C supply, the collector-to-emitter conducting path of an NPN transistor 60 is connected in series circuit relationship with the positive high voltage D-C supply terminal 27'. The transistor 60 is connected as an emitter follower so that the voltage appearing at the emitter electrode is the same as the voltage applied its base electrode. The voltage appearing on the base electrode is clipped by a low current capacity Zener diode 61 having its anode connected to the negative high voltage D-C terminal 28'. A biasing resistor 62 for the transistor 60 is connected directly across its collector and base electrodes. The phase delay timing circuit is connected across the low voltage D-C supply terminals 30' and 31', as well as a circuit for discharging the timing capacitor as the line voltage passes through a voltage zero. The charging element of the timing circuit comprises a light sensitive insulated gate field-effect transistor 63 having its source connected to a positive voltage D-C supply terminal 30' and its drain coupled through the timing capacitor 41' to the low voltage D-C supply terminal 31'. To discharge the timing capacitor 41' at the end of each timing cycle, an NPN transistor 64 is arranged to shunt the timing circuit by having its collector and emitter connected respectively to the low voltage D-C supply terminals 30' and 31'. An additional PNP transistor 65 and NPN transistor 66 are provided to maintain the shunting transistor 64 non-conductive except during the short interval when the line voltage passes through the voltage zero. The emitter-to-collector conducting path of the transistor 65 is connected in series circuit relationship with the positive low voltage D-C supply terminal 30', and the collector of the transistor 66 is connected through a biasing resistor 67 to the junction between the two transistors 60 and 65 in the positive low voltage D-C supply treminal 30', while the emitter electrode of the transistor 66 is coupled directly to the negative low voltage D-C supply terminal 31'. To provide base bias, the series combination of a resistor 68, two dioes 69 and 70, and another resistor 71 is connected between the base of the transistor 66 and the junction between the two transistors 60 and 65. The base electrode of the transistor 65 is connected to the junction between the resistor 68 and the diode 69 so that the resistor 68 provides the base bias for this transistor. To complete this network, the base electrode of transistor 64 is connected directly to the collector electrode of the transistor 66.

The two transistors 65 and 66 are conductive approximately during the time the voltage on the low voltage D-C supply terminals 30' and 31' is above the avalanche breakdown voltage of the Zener diode 61. At this time there is sufficient base bias to turn on these two transistors and maintain them turned on. When the transistor 66 is conducting, the base of the shunting transistor 64 is approximately at the potential of the negative low voltage D-C supply terminal 31', so that it is biased off. When the voltage in the low voltage D-C supply terminals 30' and 31' falls below the avalanche breakdown value of the Zener diode 61, the transistors 65 and 66 are now biased off, but there is a small positive voltage applied through the resistor 67 which is sufficient to turn on the shunting transistor 64 and render it conductive to discharge the timing capacitor 41'. Although the transistor 64 has relatively low conductivity because the biasing potential is relatively low, it will be recalled that the timing capacitor 41' is a relatively small capacitor, and this arrangement permits full discharge of the timing capacitor.

The insulated gate field-effect transistor 63 is a light sensitive device which can act as a sensor as well as being a resistive element in the RC timing circuit. As is known, the drain-substrate junction of a metal oxide semiconductor field-effect transistor is sensitive to light and results in changing the conductivity of the conducting channel between the source and drain electrodes. Advantage is taken of this fact to have the light sensitive field-effect transistor 63 act as a sensor. As can be seen in FIG. 5, the equivalent circuit for a light sensitive metal oxide semiconductor field-effect transistor comprises the parallel combination of the source-to-drain conducting channel of the field-effect transistor and a back biased diode 72 having its anode connected to the drain of the transistor and its cathode connected to the source. By reason of the back biased diode 72, the timing circuit is enabled to discharge through the shunting transistor 64. Returning to FIG. 4, a first input control signal can control the amount of light directed onto the insulated gate field-effect transistor 63, to provide a first control input to vary rate of charging of the timing capacitor 41'. In addition, a second control signal input can be applied to the gate 73 of the field-effect transistor 63 to provide an additional input for controlling the conductivity of the transistor. This second manner of control occurs because the source-to-drain current of a field-effect transistor is a function of the gate-to-source voltage. The manner of using the control inputs to the transistor 63 will be commented on later.

The voltage on the timing capacitor 41' is sensed by the insulated gate field-effect transistor 43' which has its gate connected to the junction point 42'. The source and drain electrodes of the field-effect transistor 43' are coupled respectively to the positive and negative low voltage D-C supply terminals 30 and 31 which derive their power from the first full wave diode bridge 22. The input terminals of the diode bridge 22 are connected directly to the gate of the triac power switching device 11 and to the opposite load terminal *a*. In place of the transistor 29 used in the other circuits, the shunting device connected across the high voltage D-C output terminals 27 and 28 of the diode bridge 22 is now a silicon controlled rectifier 29'. Also connected across the high voltage D-C output terminals 27 and 28 are a transistor 60' connected as an emitter follower, and a Zener diode 61' together with a biasing resistor 62' which function in the same manner as the previously described elements 60, 61, and 62 to provide the low voltage D-C supply terminals 30 and 31.

Upon being rendered conductive, the field-effect transistor 43' develops a turn-on signal to be applied to the gate of the SCR 29'. The appearance of the potential on the drain electrode of the field-effect transistor 43' biases on the transistor 53' which acts to sharply increase the turn-on signal. The emitter of the transistor 53' is connected through a pair of resistors 74 and 75 to the low voltage D-C supply terminal 31, and the base electrode of a first transistor amplifier 76 is connected between the two resistors 74 and 75. The emitter of the transistor 76 is coupled to the supply terminal 31 through a biasing diode 77, and its collector is connected through a resistor 78 to the positive supply terminal 30 and also through a base bias diode 79 to the base of a second transistor amplifier 80. The collector of the transistor 80 is connected directly to the supply terminal 30 while its emitter is connected through a limiting resistor 81 to the gate of the SCR 29'. A small resistor 82 in the cathode-to-gate circuit of the SCR 29' limits the voltage across the gate-to-cathode junction. The two transistor amplifiers 76 and 80 operate in the usual manner to increase the gain of the turn-on signal derived from the field-effect transistor 43'. Upon being rendered conductive, the SCR 29' derives the energy for the phase control or gating signal from the main power circuit in which the load 12 is connected and applies a gating signal to the gate of the triac device 11 in the same manner as has been explained.

To illustrate one possible utility for the two control inputs to the sensor in the form of the field-effect transistor 63, the diagram shown in FIG. 6 includes the main elements of the power circuit of FIG. 4 including the power switching triac device 11 in series with the load 12 across the line voltage power supply terminals 13 and 14. The phase control circuit on the monolithic integrated circuit chip 15 has the essential inputs 85 and 86 which represent the input terminals of the second diode bridge 22' connected across the line voltage power supply terminals 13 and 14 for starting the timing of the phase delay angle at the voltaeg zero. The terminals 87 and 88 represent the input terminals of the first diode bridge 22 for deriving the energy for the phase control or gating signal from the opposite load terminal *a* of the triac for application to the gate electrode. One control input to the phase control circuit can comprise a feedback signal from the load 12 obtained by means of a feedback element 89 coupled across terminals 90 and 91. A second control input to the phase control circuit can take the form of a predetermined level or "set point" control signal as obtained for instance from an adjustable resistor 92. The set point input can be applied to the gate electrode 73 of the field-effect transistor 63 (FIG. 4). The feedback signal from load 12 can determine the amount of light incident upon the drain-substrate junction of the field-effect transistor 63, thus eliminating the two input terminals 90 and 91 shown in FIG. 6 as well as providing isolation between the input and output circuits. As was previously illustrated, it is possible to implement the optical input feature by using a constant intensity light source and a shutter system therefor which is actuated in accordance with some physical parameter representing a control function. For example, the shutter system may be coupled to and actuated by a drag cup for measuring speed, a diaphragm or bellows for measuring pressure, a bi-metallic element for measuring temperature, or to a simple shutter for set point control.

FIG. 7 illustrates another circuit for applying two control inputs to the timing portion of the circuit of FIG. 4 replacing the circuit elements within the area bounded by letters A to D. The single field-effect transistor 63 is replaced by two field-effect transistors **63*a* and 63*b* connected in series circuit relationship across the low voltage D-C supply terminals 30' and 31', the transistor 63*b* further being in parallel circuit relationship with the timing capacitor 41'. For speed control, the output of a tachometer 93 varies the intensity of the light output of the simple light source 94, and the amount of light coupled to sensor 63*b* is further limited by a predetermined amount by means of a movable shutter 95 placed in proper position for set point control. In this arrangement the field-effect transistor 63*a* may be turned on at the start of the timing cycle and the conductivity of the other transistor 63***b* determines the amount of current that is shunted from the timing capacitor 41'. This circuit exhibits the correct sense in that increasing the input to the transistor 63*b* will decrease the phase angle. Alternatively, of course, additional control signal inputs may be applied to the first transistor 63*a*.

Other forms of sensors which are usable in the various timing circuits which have been described are illustrated in FIG. 8(*a*) and (*b*). FIG. 8(*a*) shows a field-effect transistor 63*b'* in which the conducting channel or inversion layer which extends between the source and drain electrodes is treated as a Hall Effect element. A strong magnetic field which may be about 2 kilogauss applied perpendicular to the current flow produces a voltage component which is mutually perpendicular to both the current and the magnetic field. This voltage is thus proportional to the product of current and field. With this type of sensor it is possible to mount a permanent magnet 96 close to the integrated circuit chip for movement toward and away from the chip as for instance for set point control. In FIG. 8(*b*), the pressure sensitivity of a bipolar transistor can be employed as an input signal mechanism. A sharp pressure stylus 97 transfers pressure to the emitter electrode of the PNP transistor 98 to change the conductivity of the transistor in accordance with the amount of pressure applied. Using this effect, a set point or gain control can be constructed by simply applying pressure to the integrated circuit chip component with a simple screw arrangement. In like manner, a MOS field-effect transistor has strain sensitivity. Film depositions on the silicon chip can also be used, such as the previously mentioned polycrystalline photodetectors and magnetoresistive devices. There is further the possibility of using a variable MOS capacitor in the timing circuit to adjust the phase delay.

For some applications requiring a power thyristor having a large load current carrying capacity, the gating signal produced by the foregoing phase control circuits may not be large enough to have sufficient power to fire the device. In this case, these phase control circuits fabricated in whole or in part as monolithic integrated circuits can be employed to actuate another pulse forming circuit for generating the large gate pulses which are required. For instance, the phase control circuit can produce a gating signal which is applied to a unijunction relaxation oscillator. The unijunction transistor oscillator can be turned on by the input pulse and turned off by the power line voltage zero. Alternatively, a transformer can be employed at the output of the monolithic phase control circuit.

The improved phase control circuits which have been described have several features which make them suitable for manufacture as monolithic integrated circuits. These include, in review, the derivation of the energy for the phase control signal from the main load power circuit by means of a full wave rectifier, the output of which is shunted by a gate turn-on unidirectional conducting solid state device such as a transistor or silicon controlled rectifier. Although the timing of the phase delay angle is performed in an RC timing circuit, the capacitor can be made relatively small, so as to be integratable without making the resistance unduly large, by connecting the junction of the timing capacitor and charging resistor to the gate of a gate controlled high input impedance device such as an insulated gate field-effect transistor. The resistive element of the timing circuit desirably is a solid state device whose conductivity is altered by the application of externally applied signals, such as photoconductors, phototransistors, photodiodes, photoresistors, light or magnetic sensitive field-effect transistors, or strain sensitive transistors. The use of these devices as sensors to control the rate of charging of the timing capacitor in accordance with one or more input control signals reduces the number of inputs to the phase control circuit and provides voltage isolation. The input control signals may be set to a desired fixed level for closed loop control, or may be continuously variable in feedback circuits in accordance with control functions such as motor speed control, temperature, pressure, etc. The circuit of FIG. 1 is a hybrid approach using an intermediate supply voltage for the full wave rectifier, and also conventional sensors and a conventional RC timing circuit which are not fabricated as a monolithic integrated circuit.

While the invention has been particularly shown and described with reference to preferred embodiments thereof, it will be understood by those skilled in the art that various changes in form and details may be made therein without departing from the spirit and scope of the invention.

What we claim as new and desire to secure by Letters Patent of the United States is:

1. A phase controlled circuit including in combination semiconductor switching means having a plurality of terminals including a pair of load terminals which are connected in series circuit relationship with a load across a pair of power supply terminals, and phase control circuit means for applying a gating signal to said semiconductor switching means characterized by full wave rectifying means having a pair of input terminals and a pair of high voltage direct current output terminals, said pair of input terminals being effectively coupled across one of the terminals of said semiconductor switching means and a point on said series connected circuit to supply power to said rectifying means.

shunting means comprising a conductivity controlled semiconductor conducting device having a control electrode and a pair of load terminals coupled across said high voltage direct current output terminals, means effectively coupled across the output terminals of said rectifying means for providing a pair of low voltage direct current supply terminals, timing circuit means comprising the series circuit combination of a charging resistive element and a charging capacitor;

sensing means effectively coupled across said low voltage direct current supply terminals for sensing a control function to determine the rate of charging of said charging capacitor, and means connected across said low voltage direct current supply terminals that is responsive to said sensing means for applying a turn-on signal to the control electrode of said shunting means to change the conductivity thereof and shunt the high voltage direct current output terminals of said rectifying means, wherby a gating signal is derived for the semiconductor switching means.

2. The circuit set forth in claim 1 wherein said rectifying means is a full wave diode bridge, said timing circuit means is coupled between one of said input terminals and one of the load terminals of said semiconductor switching means which further has a gate electrode connected to the junction of said resistive element and charging capacitor, said sensing means is a resistive element for controlling the operation of said means for applying a turn-on signal to the control electrode of said shunting means, and said shunting means is a transistor the impedance of which is varied to effectively shunt the resistive element of said timing circuit means by an amount which depends on the resistance value of said sensing means.

3. The circuit set forth in claim 1 wherein said rectifying means is a full wave diode bridge, and the point on said series connected circuit to which one of the input terminals of said rectifying means is connected is a point intermediate the terminals of said load so that the voltage supplied to said rectifying means is lower than the line voltage applied across said pair of supply terminals, and said timing circuit means is connected between one of said input terminals and one of the load terminals of said semiconductor switching means which further has a gate electrode coupled through a bidirectional snap device conducting means to the junction of said resistive element and charging capacitor.

4. The power circuit set forth in claim 1 wherein the timing circuit means is connected across the low voltage direct current supply terminals, and wherein the charging capacitor is a relatively small capacitor and the sensing means is the charging resistive element in the timing circuit means and comprises a solid state sensing device whose conductivity is changed by externally applied input control signals, and said means for applying a turn-on signal comprises a high input impedance conductivity controlled solid state device having a control electrode connected to the junction of said sensing means and charging capacitor, and further including a source of input control signals coupled to said sensing device.

5. The power circuit set forth in claim 4 wherein the circuit paths through said full wave rectifying means and shunting means are symmetrical for each half cycle of the voltage in said power supply terminals, and further including means for discharging said charging capacitor at the end of each timing interval.

6. A phase controlled circuit including in combination semiconductor switching means having a plurality of terminals including a pair of load terminals which are connected in series circuit relationship with a load across a pair of power supply terminals, and phase control circuit means for applying a gating signal to said semiconductor switching means characterized by full wave rectifying means having a pair of input terminals and a pair of high voltage direct current output terminals, said pair of input terminals being effectively coupled across two of the terminals of said semiconductor switching means to supply power to said full wave rectifying means, shunting means comprising a conductivity controlled semiconductor conducting device having a control electrode and a pair of load terminals coupled across said high voltage direct current output terminals, means effectively coupled across the output terminals of said rectifying means for providing a pair of low voltage direct current supply terminals, timing circuit means coupled across said low voltage direct current supply terminals which comprises the series combination of a relatively small timing capacitor and a solid state sensing device whose conductivity is changed by externally applied input control signals to vary the charging rate of said timing capacitor, a source of input control signals coupled to said sensing device, and means for applying a turn-on signal to said shunting means comprising a high input impedance solid state conducting device having a gate electrode connected directly to the junction of said sensing device and timing capacitor, whereby a gating signal is derived for the semiconductor switching means.

7. The circuit set forth in claim 6 wherein said solid state sensing device is an electro-optical device whose conductivity varies with the amount of light incident upon it, and said source of input control signals comprises a light source and means for varying the amount of light from said light source which is optically coupled to the sensing device.

8. The circuit set forth in claim 6 wherein said solid state sensing device is a device whose conductivity is varied by the strength of a magnetic field coupled to the device, and said source of input control signals produces a magnetic field.

9. The power circuit set forth in claim 6 wherein said solid state sensing device is a strain sensitive transistor, and the source of input control signals comprises means for applying pressure to said strain sensitive transistor.

10. A phase controlled circuit including in combination semiconductor switching means having a plurality of terminals including a pair of load terminals which are connected in series circuit relationship with a load across a pair of power supply terminals, and phase control circuit means for applying a gating signal to said semiconductor switching means characterized by first full wave rectifying means having a pair of input terminals which are coupled to two of the terminals of said semiconductor switching means, and also having a pair of high voltage direct current output terminals, shunting means comprising a solid state conductivity controlled conducting device having a control electrode and a pair of load terminals effectively connected across said high voltage direct current output terminals, second full wave rectifying means having a pair of input terminals which are connected across the pair of power supply terminals, and also having a pair of high voltage direct current output terminals, means coupled to the output terminals of said second full wave rectifying means for providing a pair of low voltage direct current supply terminals, timing circuit means coupled across said low voltage direct current supply terminals which comprises the series combination of a relatively small timing capacitor and a solid state sensing device whose conductivity is changed by externally applied input control signals, a source of input control signals coupled to said sensing device, gate controlled high input impedance solid state conductivity controlled conducting means having a load terminal coupled to the control electrode of said shunting means and a gate electrode which is connected directly to the junction of said timing capacitor and sensing device for sensing the voltage on the timing capacitor and applying a turn-on signal to said shunting means, whereby a gating signal is derived for the semiconductor switching means, and means for discharging said timing capacitor upon passage through a voltage zero of the voltage appearing in said pair of power supply terminals.

11. The power circuit set forth in claim 10 wherein said gate controlled high input impedance solid state conducting device is an insulated gate field-effect transistor having a threshold gate-to-source voltage below which the field-effect transistor is nonconductive and above which it is conductive.

12. The power circuit set forth in claim 11 wherein said semiconductor switching means is a bidirectional conducting device, said first and second rectifying means are full wave diode bridges, said second diode bridge further having a resistor connected between one of the input terminals and one of said power supply terminals, and said shunting means in a silicon controlled rectifier.

13. The power circuit set forth in claim 10 wherein additional means are coupled to the output terminals of the first full wave rectifying means for providing another pair of low voltage direct current supply terminals, the load terminals of said gate controlled high input impedance solid state conductivity controlled conducting means being effectively coupled across said other pair of low voltage direct current supply terminals.

14. The power circuit set forth in claim 10 further including additional means coupled to the output terminals of said first full wave rectifying means for providing another pair of low voltage direct current supply terminals, and wherein said gate controlled high input impedance solid state conducting device is an insulated gate field-effect transistor having its load terminals effectively coupled across said other pair of low voltage direct current supply terminals, the aforementioned load terminal also being connected through amplifying means to the control electrode of said shunting means for amplifying the turn-on signal derived when the voltage on said timing capacitor renders conductive the insulated gate field-effect transistor.

15. The power circuit set forth in claim 10 wherein the sensing device is provided by an insulated gate field-effect transistor having a gate electrode to which the source of input control signals is coupled to change its conductivity, and an additional source of input control signals coupled to the insulated gate field-effect transistor to further change its conductivity, whereby the rate of charging of the timing capacitor is dependent upon both of the input control signals.

16. The power circuit set forth in claim 15 wherein the first-mentioned source of control signals is set to a predetermined level and the second-mentioned source of control signals is coupled in feedback relationship to the load and varies in accordance with a control function.

17. A gating control circuit comprising monolithic integrated circuit conductivity controlled semiconductor solid state sensing means for controlling electric current flow, externally applied input control means acting on said conductivity controlled semiconductor solid state sensing means for controlling electric current flow therethrough, and electric circuit means including power supply terminals for a source of electric energy and load means coupled to and controlled by current flow through said conductivity controlled semiconductor solid state sensing means, wherein said electric circuit means includes monolithic integrated circuit gating signal shaping and amplifying means controlled by electric current flow through said conductivity controlled semiconductor solid state sensing means, and power amplifier means for supplying the load means coupled to and controlled by the output from said gating signal shaping and amplifying means.

18. A gating control circuit according to claim 17 wherein the conductivity controlled semiconductor solid state sensing means comprises a light sensitive semiconductor, and the externally applied input control means comprises a controllable light source for controlling the conductivity of said conductivity controlled semiconductor solid state sensing means.

19. A gating control circuit according to claim 17 wherein the conductivity controlled semiconductor solid state sensing means comprises a magnetic sensitive semiconductor, and the externally applied input control means comprises a controllable magnetic field source for controlling the conductivity of said conductivity controlled semiconductor solid state sensing means.

20. A gating control circuit comprising monolithic integrated circuit conductivity controlled semiconductor solid state sensing means for controlling electric current flow, externally applied input control means acting on said conductivity controlled semiconductor solid state sensing means for controlling electric current flow therethrough, and electric circuit means including power supply terminals for a source of electric energy and load means coupled to and controlled by current flow through said conductivity controlled semiconductor solid state sensing means, wherein said electric circuit means includes a timing capacitor connected to said conductivity controlled semiconductor solid state sensing means whose charging rate is determined by the conductivity of said conductivity controlled semiconductor solid state sensing means, high input impedance gating signal amplifier means coupled to and controlled by the charging rate of the timing capacitor, and power amplifier means supplying the load means and having its input coupled to and controlled by the output from said gating signal amplifier means.

21. A gating control circuit according to claim 20 wherein the high input impedance gating signal shaping and amplifier circuit means comprises a field effect transistor amplifier.

22. A gating control circuit according to claim 21 wherein the power amplifier means comprises a gate controlled semiconductor of the thyristor type.

23. A gating control circuit according to claim 22 wherein the conductivity controlled semiconductor solid state sensing means comprises a light sensitive semiconductor, and the externally applied input control means comprises a controllable light source for controlling the conductivity of said light sensitive semiconductor solid state sensing means.

24. A gating control circuit according to claim 23 wherein the gating signal current carrying components of the gating control circuit are manufactured in monolithic integrated circuit form.

25. A gating control circuit according to claim 22 wherein the conductivity controlled semiconductor solid state sensing means comprises a magnetic field sensitive semiconductor, and the externally applied input control means comprises a controllable magnetic field source for controlling the conductivity of said magnetic sensitive semiconductor solid state sensing means.

26. A gating control circuit according to claim 25 wherein the gating signal current carrying components of the gating control circuit are manufactured in monolithic integrated circuit form.

References Cited

UNITED STATES PATENTS

| | | | |
|---|---|---|---|
| 3,221,241 | 11/1965 | Greenberg et al. | 323—22 XR |
| 3,328,606 | 6/1967 | Pinckaers | 307—252 |
| 3,348,131 | 10/1967 | Banks | 307—262 XR |

DONALD D. FORRER, Primary Examiner

J. ZAZWORSKY, Assistant Examiner

U.S. Cl. X.R.

307—262, 293, 304, 308; 315—196, 272; 323—22